(12) United States Patent
Mori

(10) Patent No.: US 6,396,762 B2
(45) Date of Patent: May 28, 2002

(54) ELECTRONIC APPARATUS STORING DATA IN A VOLATILE MEMORY AND METHOD FOR PROTECTING DATA STORED THEREIN

(75) Inventor: Shinichi Mori, Shizuoka-ken (JP)

(73) Assignee: Toshiba Tec Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/888,481

(22) Filed: Jun. 25, 2001

(30) Foreign Application Priority Data

Jun. 27, 2000 (JP) .......................................... 2000-192893

(51) Int. Cl.[7] ................................................. G11C 7/24
(52) U.S. Cl. ...................... 365/228; 365/226; 365/227; 365/195; 365/185.33
(58) Field of Search ................................ 365/228, 227, 365/226, 195, 185.04, 185.33

(56) References Cited

U.S. PATENT DOCUMENTS

| 5,396,637 A | | 3/1995 | Harwell et al. ............. 365/228 |
| 5,914,538 A | * | 6/1999 | Kurosawa et al. ............ 307/18 |
| 6,161,184 A | * | 12/2000 | Nimura ....................... 713/200 |

* cited by examiner

*Primary Examiner*—Andrew Q. Tran
(74) *Attorney, Agent, or Firm*—Frishauf, Holtz, Goodman & Langer & Chick, P.C.

(57) ABSTRACT

The present invention is provided with a switch circuit which can turn on/off electric power supply from a battery. Further, a CPU transfers and evacuates specific data stored in a DRAM when electric power supply from a main power supply is stopped and electric power supply from a battery is performed. Thereafter, the CPU turns off the switch circuit and stops electric power supply from the battery.

7 Claims, 2 Drawing Sheets

ELECTRONIC APPARATUS STORING DATA IN A VOLATILE MEMORY AND METHOD FOR PROTECTING DATA STORED THEREIN

CROSS-REFERENCE TO RELATED APPLICATIONS

This application is based upon and claims the benefit of priority from the prior Japanese Patent Application No. 2000-192893, filed Jun. 27, 2000, the entire contents of which are incorporated herein by reference.

BACKGROUND OF THE INVENTION

1. Field of the Invention

The present invention relates to an electronic apparatus for storing data which must be protected even in power outage in a volatile memory such as a RAM, and a method for protecting data in this electronic apparatus.

2. Description of the Related Art

In an electronic apparatus such as multi-function peripherals (MFP), a DRAM has been conventionally often used in order to store data. When data to be stored in the DRAM must be protected even in power outage, a sub power supply using a battery is provided as well as a main power supply. When electric power supply from the main power supply is stopped, data stored in the DRAM is protected by the electric power supply from this sub power supply.

However, when backup is effected by using the battery in this manner, the state with the electric power supply from the main power supply being stopped lasts for a long time, and hence the data stored in the DRAM is lost when the battery is completely discharged.

In order to protect the data stored in the DRAM for a long period of time, increase in capacity of the battery can be considered. However, the battery with the large capacity leads to increase in size and price. Further, granting that the capacity is large, the capacity is limited, and the data can not be assuredly prevented from being lost.

Use of a non-volatile memory such as a flash memory instead of the DRAM can be also considered. However, the operating speed of the non-volatile memory is generally lower than that of the DRAM. Therefore, when the non-volatile memory is used, the speed of various operations involving the memory access is lowered.

U.S. Pat. No. 5,396,637 discloses the technique of storing data from a RAM into a hard disk drive when the supply of power from the power supply is stopped. The technique ensures the protection of the data.

In view of cost benefit, however, such a large apparatus as a disk drive should not be used only to save the data stored in the RAM. Additionally, a large battery must be used to drive a disk drive, which consumes much power. In view of this, too, a disk drive should not be used.

BRIEF SUMMARY OF THE INVENTION

It is an object of the present invention to hold data even if electric power supply from a main power supply is stopped while a volatile memory holds the data in normal operation.

The above-mentioned object of the present invention in attained by an electronic apparatus comprising: a volatile first memory; a main power supply configured to supply electric power to the first memory; a sub power supply configured to supply electric power to the first memory when the main power supply is stopped; a non-volatile second memory configured to store an operation program of the processor; a data transferring section configured to store in the second memory predetermined specific data stored in the first memory in response to start of electric power supply from the sub power supply; and a supply stopping section configured to stop electric power supply from the sub power supply in response to completion of storing the specific data in the second memory by the data transferring section.

Further, the above-mentioned object of the present invention in attained also by a data protection method comprising: a step of storing in a non-volatile second memory which stores an operation program of predetermined processor, predetermined specific data stored in the first memory in response to start of electric power supply from the sub power supply; and a step of stopping electric power supply from the sub power supply in response to completion of storing the specific data in the second memory.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

DETAILED DESCRIPTION OF THE INVENTION

An embodiment according to the present invention will now be described hereinafter with reference to the drawings.

Figure 1:
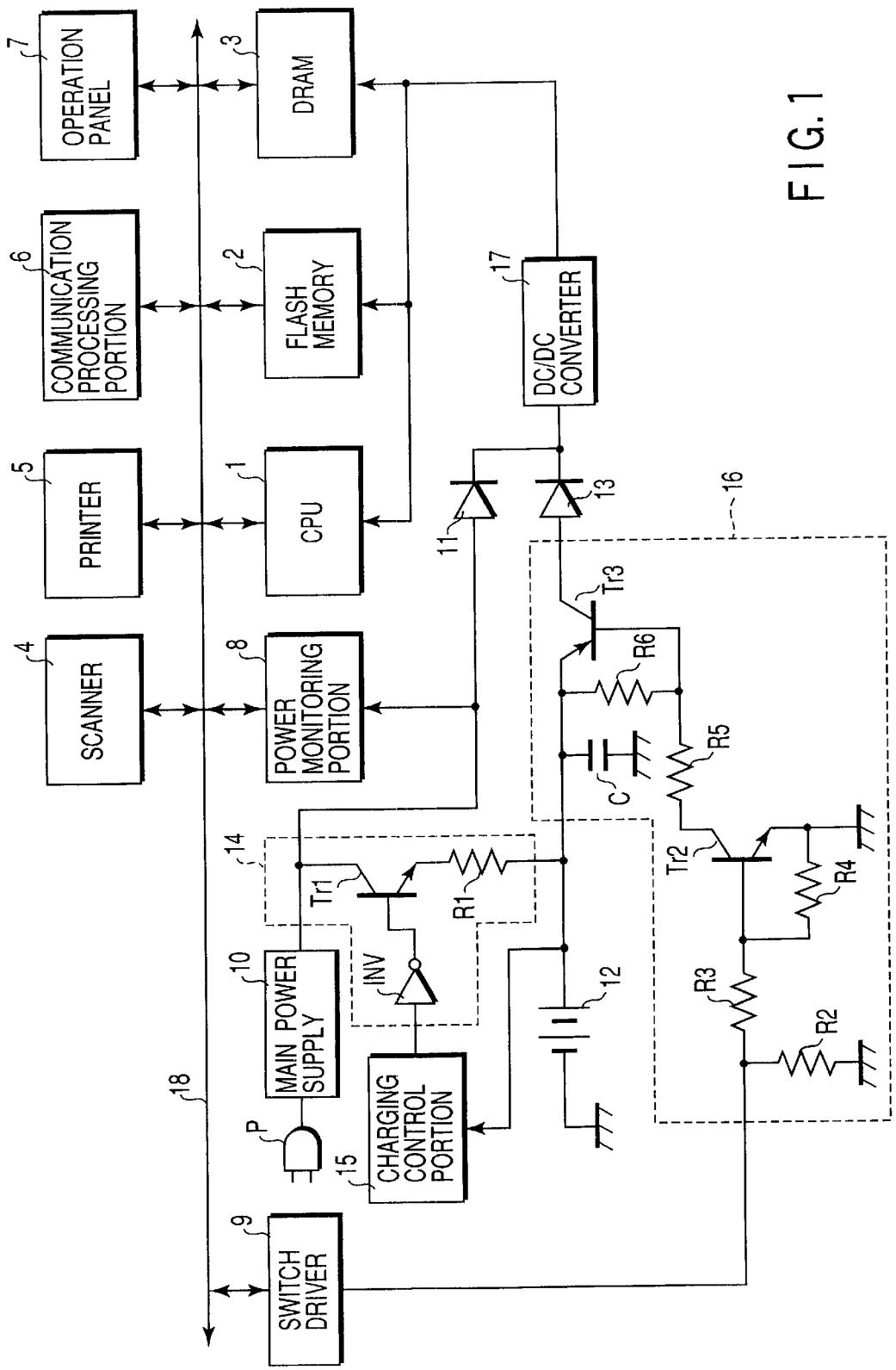
FIG. 1 is a block diagram showing a primary structure of an MFP configured by applying an electronic apparatus according to an embodiment of the present invention.

FIG. 1 is a block diagram showing a primary structure of an MFP configured by applying an electronic apparatus according to the embodiment.

As shown in the drawing, the MFP according to this embodiment has: a CPU 1; a flash memory 2; a DRAM 3; a scanner 4; a printer 5; a communication processing portion 6; an operation panel 7; a power monitoring portion 8; a switch driver 9; a main power supply circuit 10; a diode 11; a battery 12; a diode 13; a charging circuit 14; a charging control portion 15; a switch circuit 16; and a DC/DC converter 17. Furthermore, the CPU 1, the flash memory 2, the DRAM 3, the scanner 4, the printer 5, the communication processing portion 6, the operation panel 7, the power monitoring portion 8, and the switch driver 9 are connected to each other through a system bus 18.

The CPU 1 carries out control processing for controlling the respective portions in the MFP as a whole based on a program stored in the flash memory 2. Moreover, when the respective portions operate based on the control processing by the CPU 1, the function as the MFP can be realized.

The flash memory 2 is a non-volatile memory and corresponds to a second memory. The flash memory 2 stores therein the program of the CPU 1. In addition, the flash memory 2 is constituted by using a general purpose device having a larger storage capacity than the size of the program. The flash memory 2, therefore, stores therein the program in a partial storage area thereof, and any other storage area is an empty area.

The DRAM 3 is used for temporarily storing various kinds of data required when the CPU 1 executes the various kinds of processing. Additionally, the DRAM 3 stores therein specific data which must be protected in any power outage such as journal data, telephone directory data, registration data of a one-touch key, communication logs and others. That is, the DRAM 3 corresponds to a first memory.

The scanner 4 generates the specific data by carrying out reading of a manuscript, digitization or various kinds of correction processing such as shading correction.

The printer 5 prints an image indicated by the image data on printing paper.

The communication processing portion 6 has a coding/decoding portion, an NCU, a modem and others and executes processing for facsimile communication.

The operation panel 7 is provided with a key input portion for accepting input of various directions relative to the CPU 1 from a user, a display portion for displaying various kinds of information for a user, and others.

The power monitoring portion 8 monitors a voltage of power generated and outputted by the main power supply circuit 10 and detects stop of electric power supply from the main power supply circuit 10.

The switch driver 9 generates a control signal for turning on/off the switch circuit 16 under control of the CPU 1 and supplies this control signal to the switch circuit 16.

The main power supply circuit 10 acquires electric power from a commercial power source through a power supply plug P and generates electric power having a voltage value of 5V. Further, the main power supply circuit 10 supplies the generated electric power to the DC/DC converter 17 through the diode 11. Furthermore, the electric power generated by the main power supply circuit 10 is also utilized for operating the respective portions other than the CPU 1, the flash memory 2 and the DRAM 3.

The diode 11 prevents the electric current outputted from the battery 12 from flowing to the main power supply circuit 10 and the power monitoring portion 8.

The battery 12 corresponds to a sub power supply. This battery 12 supplies the electric power to the DC/DC converter 17 through the diode 13 and the switch circuit 16 when the electric power supply from the main power supply circuit 10 is stopped.

The diode 13 prevents the electric power supplied from the main power supply circuit 10 from flowing to the battery 12 without passing through the charging circuit 14.

The charging circuit 14 is constituted by an inverter INV, a transistor Tr1, and a resistor R1 as shown in FIG. 1. Furthermore, the charging circuit 14 supplies the electric power outputted from the main power supply circuit 10 to the battery 12 to charge the battery 12 under control of the charging control portion 15.

The charging control portion 15 monitors a charging capacity of the battery 12 and controls the charging circuit 14 so that charging to the battery 12 can be appropriately carried out.

The switch circuit 16 is constituted by resistors R2, R3, R4, R5 and R6, transistors Tr2 and Tr3, and a capacitor C as shown in FIG. 1. Moreover, the switch circuit 16 turns on/off the electric power supply from the battery 12 to the DC/DC converter 17.

Meanwhile, processing means realized by software processing executed by the CPU 1 based on the program stored in the flash memory 2 has data transferring section, switch controlling section and data returning means as well as processing means for realizing known general functions in the MFP.

Here, the data transferring section stores the specific data stored in the DRAM 3 to the flash memory 2 in order to evacuate this data in response to stop of the electric power supply from the main power supply circuit 10.

The switch controlling section stops power consumption from the battery 12 by turning off the switch circuit 16 after transfer of the specific data is completed by the data transferring section. In this way, the supply stopping section is realized by the switch controlling section and the switch circuit 16.

Further, the data returning means returns the specific data(evacuated data) in the flash memory 2 to the DRAM 3 in response to restoration of the electric power supply from the main power supply circuit 10.

The operation of the MFP having the above-described structure will now be described. Since the operation for realizing the original functions as the MFP such as a copying function, a scanning function or a facsimile communication function is similar to those of the conventional MFP, explanation of that operation is omitted herein. Here, the operation concerning protection of the specific data at the time of occurrence of the power outage will be described in detail.

When the electric power supply from a commercial power source can not be normally accepted through the power supply plug P due to power outage or coming off of the power supply plug P, the main power supply circuit 10 stops the electric power supply to the DC/DC converter 17. Then, the electric power supply from the battery 12 to the DC/DC converter 17 is started. It is to be noted that the switch driver 9 supplies a control signal on a High level to the switch circuit 16 under control of the CPU 1. Therefore, the switch circuit 16 is in the ON state, and the above-described electric power supply from the battery 12 to the DC/DC converter 17 is carried out. As described above, even after the electric power supply from the main power supply circuit 10 is stopped, the DC/DC converter 17 keeps operating, and the CPU 1, the flash memory 2 and the DRAM 3 continuously operate.

On the other hand, the power monitoring portion 8 detects occurrence of the power outage from the fact that a voltage of the power supply from the main power supply circuit 10 has lowered to a given reference value, and informs the CPU 1 of this detection.

Figure 2:
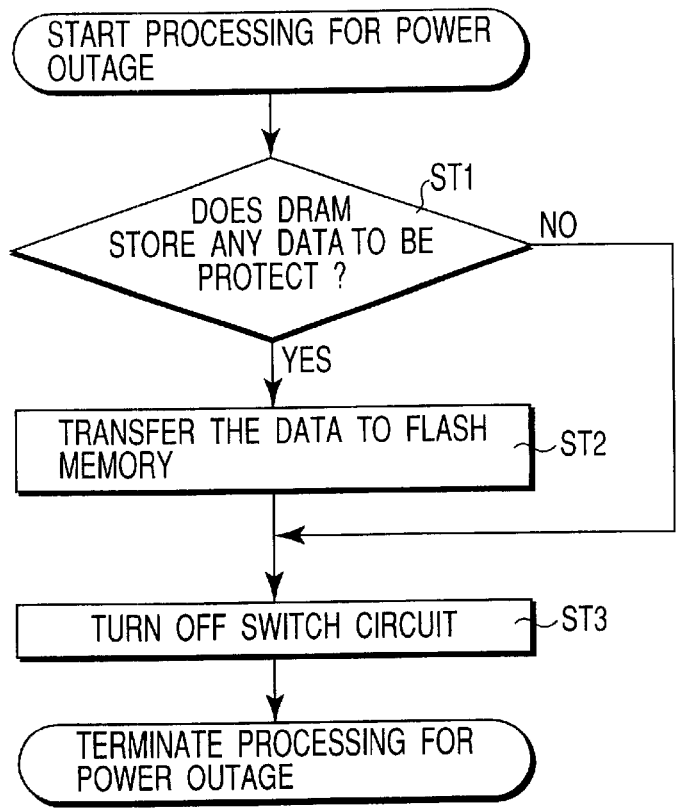
FIG. 2 is a flowchart showing the processing procedure at the time of power outage by a CPU 1 in FIG. 1.

Meanwhile, if occurrence of the power outage is detected by the power monitoring portion 8 and informed, the CPU 1 executes the processing during the power outage such as shown in FIG. 2.

In this processing during the power outage, the CPU 1 first confirms whether specific data is stored in the DRAM 3 (step ST1).

Here, if the CPU 1 confirms that the specific data is stored in the DRAM 3, the CPU 1 transfers the specific data to an empty storage area in the flash memory 2 (step ST2). Furthermore, when transfer of the specific data is completed, the CPU directs the switch driver 9 to turn off the switch circuit 16 (step ST3). Then, the CPU 1 completes the current processing during the power outage.

Upon receiving the above-described direction from the CPU 1, the switch driver 9 lowers the control signal fed to the switch circuit 16 to a Low level. Then, the switch circuit 16 is turned off, and the electric power supply from the battery 12 to the DC/DC converter 17 is stopped. In response to this, the electric power supply from the DC/DC converter 17 to the CPU 1, the flash memory 2 and the DRAM 3 is also stopped.

It is to be noted that if it is confirmed that the specific data is not stored in the DRAM 3 at the time of occurrence of the power outage at the step ST1, the CPU 1 skips the step ST2 and proceeds to the step ST3 because there is no data to be evacuated, thereby turning off the switch circuit 16.

On the other hand, when the electric power supply from a commercial power source can be accepted through the power supply plug P, the main power supply circuit 10 restarts the operation, and the electric power is supplied to the DC/DC converter 17. In response to this, the DC/DC converter 17 restarts the operation, and the electric power is supplied to the CPU 1, the flash memory 2, and the DRAM 3, thereby enabling the operation of these respective portions.

Figure 3:
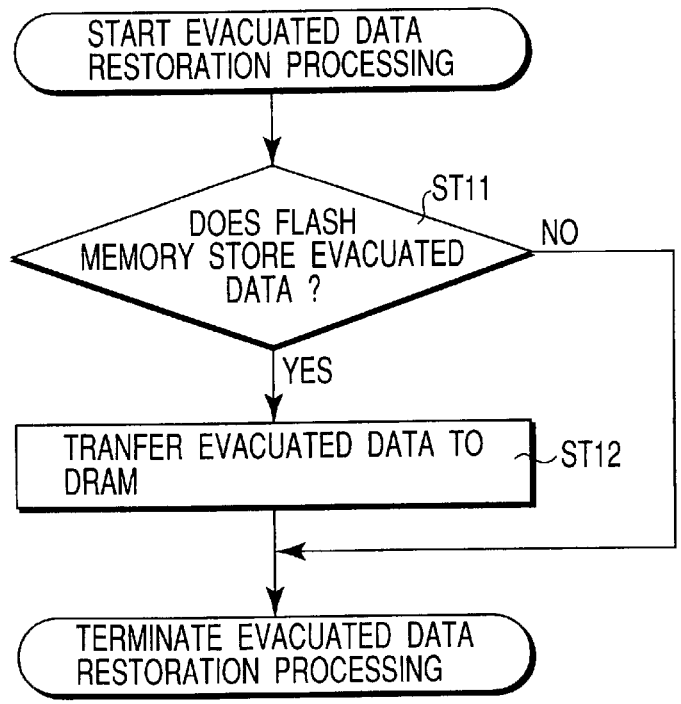
FIG. 3 is a flowchart showing the processing procedure at the time of evacuated data restoration processing by the CPU 1 in FIG. 1.

Meanwhile, when the electric power supply is restarted, the CPU 1 executes the evacuated data restoration processing such as shown in FIG. 3 in a series of the startup procedures.

In the evacuated data restoration processing, the CPU 1 first confirms whether the specific data is stored in the flash memory 2 (step ST11). If it is confirmed that the specific data is stored in the flash memory 2, the CPU 1 transfers the specific data to the DRAM 3 (step ST12). That is, the specific data evacuated in the flash memory 2 is restored in the DRAM 3. Upon completing transfer of the specific data, the CPU 1 terminates the current evacuated data restoration processing.

However, if it is confirmed that the specific data is not stored in the flash memory 2 in the step ST11, the CPU 1 terminates the current evacuated data restoration processing without executing the step ST12 because there is no data to be restored.

As described above, according to the present embodiment, if the electric power is not supplied from the main power supply circuit 10, the operation of the CPU 1, the flash memory 2 and the DRAM 3 is temporarily continued by the electric power supply from the battery 12. Moreover, in this period, the specific data stored in the DRAM 3 is evacuated in the empty storage area of the flash memory 2. When evacuation of the specific data is completed, the switch circuit 16 is turned off and the electric power supply from the battery 12 is stopped. Therefore, since the specific data is stored in the flash memory 2 when the power outage occurs, the specific data can be assuredly held even if the power outage occurrence period is prolonged. In addition, since the battery 12 performs the electric power supply only in a short period of time, the compact and inexpensive apparatus with a small capacity can be realized.

Additionally, according to this embodiment, the specific data is evacuated by utilizing an empty storage area in the flash memory 2 provided for storing the program of the CPU 1. Thus, the flash memory does not have to be newly provided in order to evacuate the specific data, and the inexpensive apparatus can be realized with a simple structure.

Further, according to the present embodiment, if there is the specific data evacuated in the flash memory 2 when the electric power supply from the main power supply circuit 10 is restarted, the specific data is automatically restored in the DRAM 3. Therefore, a user does not have to take a step for returning the evacuated specific data to the DRAM 3. Furthermore, the operation in the completely same state as before the power outage is enabled immediately after reactivation.

It is to be noted that the present invention is not restricted to the above-described embodiment. For example, although the flash memory 2 is used as the second memory in the above-described embodiment, any other non-volatile memory such as a regular EEPROM can be adopted.

Additionally, in the above-described embodiment, if there is the specific data evacuated in the flash memory 2 when the electric power supply from the main power supply circuit 10 is restarted, the specific data is automatically restored in the DRAM 3. However, this processing may be carried out in accordance with a user operation.

In addition, although the data transferring section, the switch controlling section and the data returning means are realized by the software processing by the CPU 1 in the above-described embodiment, they can be also realized by a hardware circuit and the like for executing the similar processing.

Further, although journal data, telephone directory data, registration data of a one-touch key, and communication logs are illustrated as concrete examples of the specific data in the above-described embodiment, the specific data is not restricted to these data, and other kinds of data such as image data may be used.

Furthermore, although the above-described embodiment shows an example in which the electronic apparatus according to the present invention is applied to the MFP, the present invention can be applied to any kind of apparatus only if that apparatus can save in a non-volatile memory data which must not be lost even at the time of the power outage.

Besides, various modifications can be made without departing from the scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic apparatus comprising:
a processor configured to execute control processing;
a volatile first memory;
a main power supply configured to supply electric power to said first memory;
a sub power supply configured to supply electric power to said first memory when said main power supply is stopped;
a non-volatile second memory configured to store an operation program of said processor;
a data transferring section configured to store in said second memory predetermined specific data stored in said first memory in response to start of electric power supply from said sub power supply; and
a supply stopping section configured to stop electric power supply from said sub power supply in response to completion of storing said specific data in said second memory by said data transferring section.

2. The electronic apparatus according to claim 1, wherein said supply stopping section comprises:
- a switch configured to turn on/off electric power supply from said sub power supply; and
- switch controlling section configured to control said switch to turn off said switch in response to completion of storing said specific data in said second memory by said data transferring section.

3. The electronic apparatus according to claim 1, further comprising data returning section configured to store said specific data in said first memory which was previously stored in said second memory in response to start of electric power supply from said main power supply.

4. The electronic apparatus according to claim 1, wherein said second memory is a flash memory.

5. The electronic apparatus according to claim 1, wherein said specific data is at least any one of journal data, telephone directory data, registration data of a one-touch key and communication logs.

6. A data protection method for protecting data stored in a volatile first memory which operates with power supply from a main power supply when electric power supply is carried out from said main power supply and operates with power supply from a sub power supply when said main power supply is stopped, said method comprising:
- a step of storing in a non-volatile second memory which stores an operation program of predetermined processor, predetermined specific data stored in said first memory in response to start of electric power supply from said sub power supply; and
- a step of stopping electric power supply from said sub power supply in response to completion of storing said specific data in said second memory.

7. The data protection method according to claim 6, further comprising a step of storing said specific data in said first memory which was previously stored in said second memory in response to start of electric power supply from said main power supply.

* * * * *